United States Patent
Saito et al.

(10) Patent No.: US 11,923,223 B2
(45) Date of Patent: Mar. 5, 2024

(54) APPARATUS AND METHOD FOR DETECTING A WAFER IN A CASSETTE

(71) Applicant: DISCO CORPORATION, Tokyo (JP)

(72) Inventors: Yoshinobu Saito, Tokyo (JP); Jonghyun Ryu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 18/053,071

(22) Filed: Nov. 7, 2022

(65) Prior Publication Data
US 2023/0147310 A1  May 11, 2023

(30) Foreign Application Priority Data
Nov. 10, 2021 (JP) ................................ 2021-183266

(51) Int. Cl.
*H01L 21/67* (2006.01)
*H01L 21/677* (2006.01)

(52) U.S. Cl.
CPC .... *H01L 21/67265* (2013.01); *H01L 21/6773* (2013.01)

(58) Field of Classification Search
CPC .......... H01L 21/67265; H01L 21/6773; H01L 21/6735; H01L 21/67766; H01L 21/6838; B25J 9/04; B25J 11/0095; B25J 13/08; B25J 15/0014; B25J 15/0616; B25J 19/021

USPC ........................................................ 250/221
See application file for complete search history.

(56) References Cited

U.S. PATENT DOCUMENTS

| | | | |
|---|---|---|---|
| 2007/0118300 A1* | 5/2007 | Mollenkopf | H01L 21/67265 702/33 |
| 2014/0234058 A1* | 8/2014 | Murata | H01L 21/67265 414/222.01 |
| 2019/0139804 A1* | 5/2019 | Takao | H01L 21/67265 |

FOREIGN PATENT DOCUMENTS

JP          2001284303 A      10/2001

* cited by examiner

*Primary Examiner* — Que Tan Le
*Assistant Examiner* — Mai Thi Ngoc Tran
(74) *Attorney, Agent, or Firm* — Greer Burns & Crain Ltd.

(57) ABSTRACT

A warning is issued about an irregularity concerning a wafer stored in a cassette if a difference between a value of an apparent thickness of the wafer and the previously obtained value of an actual thickness of the wafer exceeds a threshold value, the value of the apparent thickness of the wafer being obtained by a non-contact-type sensor for detecting a front portion of the wafer laterally of the wafer. Consequently, the wafer is prevented from being damaged when it is taken out of the cassette.

8 Claims, 7 Drawing Sheets

APPARATUS AND METHOD FOR DETECTING A WAFER IN A CASSETTE

BACKGROUND OF THE INVENTION

Field of the Invention

The present invention relates to a wafer detecting apparatus for detecting whether or not there is a wafer in a cassette that has opposite side-walls in which a plurality of pairs of horizontal slots vertically spaced from one another are defined and that is capable of storing wafers in such a manner that each of the wafers is retained by a corresponding one of the pairs of slots, the pair of slots being positioned at the same height in confronting relation to each other, a wafer delivery apparatus for delivering a wafer from the cassette and delivering a wafer into the cassette, a method of determining whether or not there is an irregularity concerning a wafer stored in the cassette, a program for enabling a computer to carry out the method, and a non-transitory recording medium that records the program therein.

DESCRIPTION OF THE RELATED ART

Device chips including integrated circuits (ICs), large-scale-integration (LSI) circuits, etc., are indispensable components in electronic equipment, typically mobile phones and personal computers. Such device chips are produced by demarcating a plurality of areas on a face side of a wafer with projected dicing lines such that each area includes a device, and dividing the wafer along the projected dicing lines.

Before being divided into individual device chips, wafers with devices formed thereon are often thinned down for the purpose of producing smaller and lighter device chips. According to one known method of thinning down wafers, a wafer is ground by a grinding apparatus that has a chuck table for holding a face side, i.e., a lower surface, of the wafer under suction thereon and a grinding wheel being disposed above the chuck table and having a circular array of grindstones mounted at circumferentially spaced intervals on a lower surface of the grinding wheel.

In order to grind wafers on a grinding apparatus, it is necessary to perform a prerequisite step for introducing those wafers into the grinding apparatus. For example, according to the general chip fabrication procedure, one lot of wafers, e.g., approximately 25 wafers, are stored in a cassette, and the cassette is then placed onto a cassette table in the grinding apparatus.

The cassette generally has opposite side-walls in which pairs of slots, e.g., 25 slots, are defined at corresponding heights in confronting relation to each other, the pairs of slots being vertically spaced from one another. The wafers are retained by the respective pairs of slots. The grinding apparatus generally has a wafer detecting apparatus having a non-contact-type sensor and a wafer delivery apparatus having a robot hand for holding one at a time the wafers, in the vicinity of the cassette table.

The wafer detecting apparatus is combined with a mechanism for opening a lid on a front side of the cassette, for example. The wafer detecting apparatus detects the height of a pair of slots that are retaining a wafer, with the non-contact-type sensor. The wafer delivery apparatus is provided as one of the components of the grinding apparatus, for example. Using the robot hand, the wafer delivery apparatus takes a wafer to be ground from the cassette and stores a ground wafer back into the cassette (see, for example, JP 2001-284303A).

When a wafer is to be removed from the cassette placed on the cassette table of the grinding apparatus, the robot hand of the wafer delivery apparatus is inserted into the cassette while referring to the height of the pair of slots as detected by the non-contact-type sensor of the wafer detecting apparatus. The robot hand thus positionally controlled makes it possible to increase the efficiency with which to carry the wafer out of the cassette.

SUMMARY OF THE INVENTION

However, the wafer retained by a pair of slots defined in the opposite side-walls of the cassette tends to flex downwardly. In particular, if a wafer is thin or has residual stresses left therein due to devices formed thereon, the wafer is often liable to warp. When a warped wafer is stored in the cassette, the wafer is likely to flex largely downwardly.

Specifically, when a wafer stored in the cassette flexes downwardly, the height of a portion of the wafer that is remote from the side-walls of the cassette, i.e., a central portion of the wafer, is likely to differ largely from the height of portions of the wafer that are close to the side-walls of the cassette, i.e., opposite end portions of the wafer. If the difference between these heights exceeds an allowable range or tolerance, when the robot hand of the wafer delivery apparatus is inserted into the cassette, it is highly probable that the robot hand will collide with the central portion of the wafer, damaging the wafer.

It is therefore an object of the present invention to prevent wafers from being damaged when they are taken out of a cassette.

In accordance with an aspect of the present invention, there is provided a wafer detecting apparatus for detecting whether or not there is a wafer in a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at the same height in confronting relation to each other. The wafer detecting apparatus includes a detecting unit having a non-contact-type sensor for detecting a front portion of the wafer laterally of the wafer in the cassette that has an open front end, a lifting and lowering unit for selectively lifting and lowering the detecting unit vertically, an output unit for outputting information regarding the wafer stored in the cassette, a controller for controlling operation of the detecting unit, the lifting and lowering unit, and the output unit, and an input unit for entering information regarding the wafer stored in the cassette into the controller. The controller includes a storage section for storing a value of an actual thickness of the wafer stored in the cassette, the value being entered from the input unit, and a threshold value representing an allowable range for a difference between a value of an apparent thickness of the wafer and the value of the actual thickness of the wafer, a determining unit for determining whether or not the difference between the value of the apparent thickness of the wafer and the value of the actual thickness of the wafer that has been stored in the storage section exceeds the threshold value, the value of the apparent thickness of the wafer being obtained by operating, while actuating the lifting and lowering unit to selectively lift and lower the detecting unit, the non-contact-type sensor to detect whether or not there is the wafer in the cassette, and a warning section for operating the output unit to issue a warning about an irregularity concerning the wafer stored in the cassette, if the determining section determines that the difference exceeds the threshold value.

In the wafer detecting apparatus according to the aspect of the present invention, the non-contact-type sensor should preferably be a light-transmissive sensor that includes a light emitter for emitting light and a light detector for detecting the light emitted from the light emitter.

In accordance with another aspect of the present invention, there is provided a wafer delivery apparatus for taking a wafer out of and into a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at the same height in confronting relation to each other. The wafer delivery apparatus includes a robot hand for holding the wafer, the robot hand having a non-contact-type sensor for detecting a front portion of the wafer laterally of the wafer in the cassette that has an open front end, a lifting and lowering unit for selectively lifting and lowering the robot hand vertically, an output unit for outputting information regarding the wafer stored in the cassette, a controller for controlling operation of the robot hand, the lifting and lowering unit, and the output unit, and an input unit for entering information regarding the wafer stored in the cassette into the controller. The controller includes a storage section for storing a value of an actual thickness of the wafer stored in the cassette, the value being entered from the input unit, and a threshold value representing an allowable range for a difference between a value of an apparent thickness of the wafer and the value of the actual thickness of the wafer, a determining unit for determining whether or not the difference between the value of the apparent thickness of the wafer and the value of the actual thickness of the wafer that has been stored in the storage section exceeds the threshold value, the value of the apparent thickness of the wafer being obtained by operating, while actuating the lifting and lowering unit to selectively lift and lower the robot hand, the non-contact-type sensor to detect whether or not there is the wafer in the cassette, and a warning section for operating the output unit to issue a warning about an irregularity concerning the wafer stored in the cassette, if the determining section determines that the difference exceeds the threshold value.

In the wafer delivery apparatus according to the other aspect of the present invention, the non-contact-type sensor should preferably be a light-transmissive sensor that includes a light emitter for emitting light and a light detector for detecting the light emitted from the light emitter.

In the wafer delivery apparatus according to the other aspect of the present invention, the robot hand should preferably be a robot hand for holding the wafer under suction forces generated by a suction source, or a robot hand for holding the wafer under suction forces produced by gas supplied from a gas supply source, on the basis the Bernoulli effect.

In accordance with a further aspect of the present invention, there is provided a method of determining whether or not there is an irregularity concerning a wafer stored in a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at the same height in confronting relation to each other. The method includes a storing step of storing a value of an actual thickness of the wafer stored in the cassette and a threshold value representing an allowable range for a difference between a value of an apparent thickness of the wafer and the value of the actual thickness of the wafer, a determining step of determining whether or not the difference between the value of the apparent thickness of the wafer and the value of the actual thickness of the wafer that has been stored in the storing step exceeds the threshold value, the value of the apparent thickness of the wafer being obtained by operating, while selectively lifting and lowering a non-contact-type sensor for detecting a front portion of the wafer laterally of the wafer in the cassette that has an open front end, the non-contact-type sensor to detect whether or not there is the wafer in the cassette, and a warning step of issuing a warning about an irregularity concerning the wafer stored in the cassette, if the determining step determines that the difference exceeds the threshold value.

In accordance with a still further aspect of the present invention, there is provided a program for a computer that includes an output unit for outputting information regarding a wafer stored in a cassette, a controller for controlling operation of the output unit, and an input unit for entering information regarding the wafer stored in the cassette into the controller, the program causing the computer to carry out a method of determining whether or not there is an irregularity concerning the wafer stored in the cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at the same height in confronting relation to each other. The method includes a storing step of storing, in a storage section of the controller, a value of an actual thickness of the wafer stored in the cassette, the value being entered from the input unit, and a threshold value representing an allowable range for a difference between a value of an apparent thickness of the wafer and the value of the actual thickness of the wafer, a determining step of determining, by a central processing unit of the controller, whether or not the difference between the value of the apparent thickness of the wafer and the value of the actual thickness of the wafer that has been stored in the storage section exceeds the threshold value, the value of the apparent thickness of the wafer being obtained by operating, while selectively lifting and lowering a non-contact-type sensor for detecting a front portion of the wafer laterally of the wafer in the cassette that has an open front end, the non-contact-type sensor to detect whether or not there is the wafer in the cassette, and a warning step of operating, by the central processing unit, the output unit to issue a warning about an irregularity concerning the wafer stored in the cassette, if the central processing unit determines that the difference exceeds the threshold value.

In accordance with a yet still further aspect of the present invention, there is provided a non-transitory recording medium storing therein a program for a computer that includes an output unit for outputting information regarding a wafer stored in a cassette, a controller for controlling operation of the output unit, and an input unit for entering information regarding the wafer stored in the cassette into the controller, the program causing the computer to carry out a method of determining whether or not there is an irregularity concerning the wafer stored in the cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at the same height in confronting relation to each other. The method includes a storing step of storing, in a storage section of the controller, a value of an actual thickness of the wafer stored in the cassette, the value being entered from the input unit, and a threshold value representing an allowable range for a difference between a value of an apparent thickness of the wafer and the value of the actual thickness of the wafer, a determining step of determining, by a central processing unit of the controller, whether or not the difference between the value of the apparent thickness of the wafer and the value of the actual thickness of the wafer that has been stored in the storage section exceeds the threshold value, the value of the apparent thickness of the wafer being obtained by operating, while selectively lifting and lowering a non-contact-type sensor for detecting a front portion of the wafer laterally of the wafer in the cassette that has an open front end, the non-contact-type sensor to detect whether or not there is the wafer in the cassette, and a warning step of operating, by the central processing unit, the output unit to issue a warning about an irregularity concerning the wafer stored in the cassette, if the central processing unit determines that the difference exceeds the threshold value.

According to the present invention, a warning is issued about an irregularity concerning a wafer stored in the cassette if the difference between the value of an apparent thickness of the wafer and the previously obtained value of an actual thickness of the wafer exceeds a threshold value, the value of the apparent thickness of the wafer being obtained by a non-contact-type sensor for detecting a front portion of the wafer laterally of the wafer. Consequently, the wafer is prevented from being damaged when it is taken out of the cassette.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
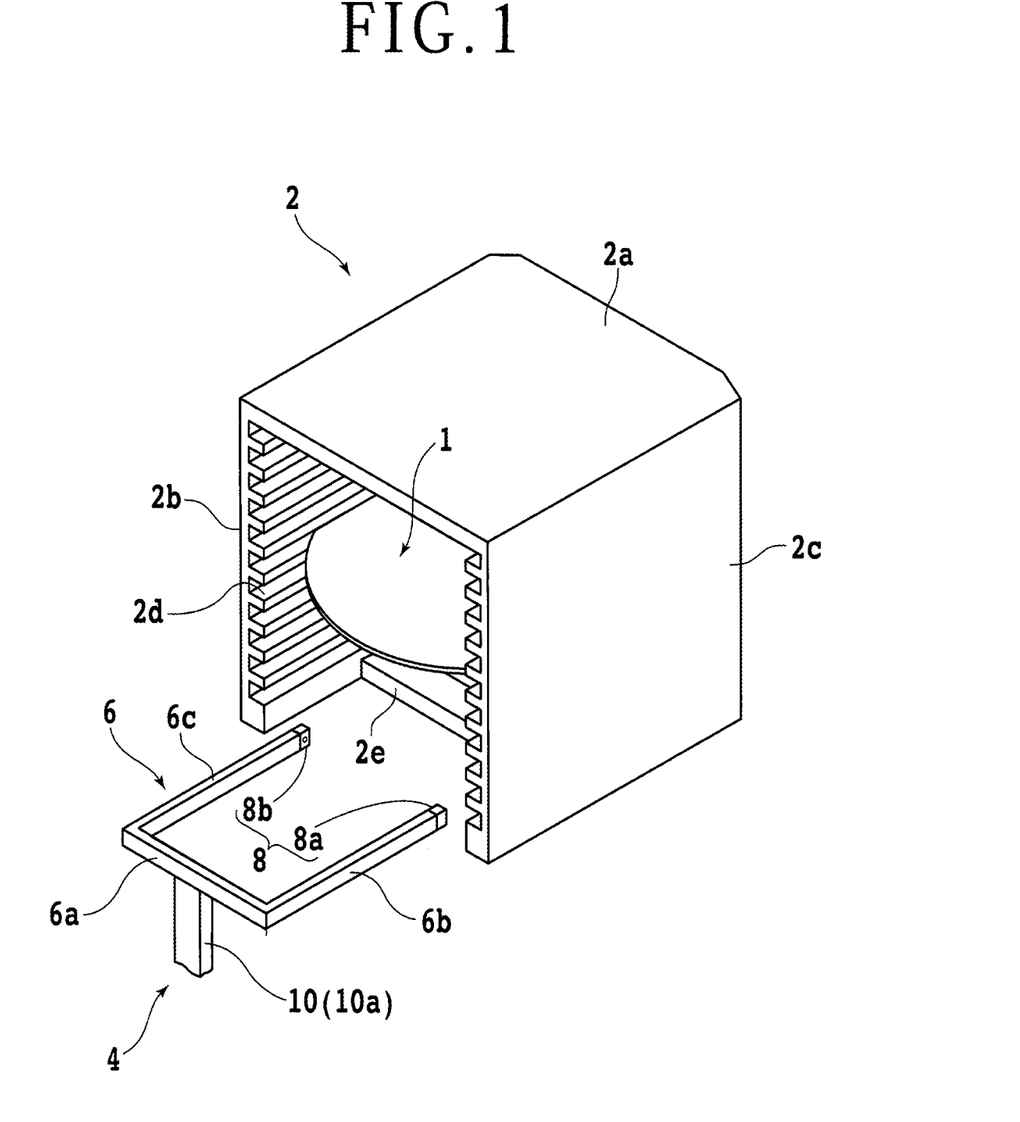
FIG. 1 is a perspective view schematically illustrating a wafer detecting apparatus by way of example.

A preferred embodiment of the present invention will be described below with reference to the accompanying drawings. FIG. 1 schematically illustrates in perspective a wafer detecting apparatus for detecting whether or not there is a wafer in a cassette for storing wafers therein. FIG. 1 also schematically illustrates by way of example a wafer to be detected by the wafer detecting apparatus and the cassette for storing wafers therein. The wafer and the cassette will first be described below, and then, the wafer detecting apparatus will be described below.

The wafer, denoted by 1 in FIG. 1, is of a circular shape and may be made of a semiconductor material such as a silicon (Si). The wafer 1 has a face side on which a plurality of areas are demarcated by a plurality of intersecting projected dicing lines, and a plurality of devices such as ICs or LSI circuits are formed in the respective areas. The wafer 1 is not limited to any particular materials, shapes, structures, sizes, etc. The wafer 1 may be a substrate made of, for example, any of other semiconductor materials, ceramic, resin, metal, or the like.

Similarly, the devices on the wafer 1 are not limited to any particular kinds, numbers, shapes, structures, sizes, layouts, etc. A film-like tape having substantially the same diameter as the wafer 1 may be affixed to the face side of the wafer 1. The tape is made of resin, for example, and protects the devices on the wafer 1 from shocks imposed on the face side of the wafer 1 when a reverse side of the wafer 1 is ground.

The cassette, denoted by 2 in FIG. 1, has a flat rectangular upper plate 2a. The upper plate 2a is of such a shape that a pair of adjacent two of its four corners are beveled and that the remaining pair of two corners are left unbeveled. The cassette 2 also has a rear-wall, not illustrated, extending vertically and perpendicularly to the upper plate 2a and having an upper end fixed to the lower side of a rear end of the upper plate 2a that is positioned between the two beveled edges.

The cassette 2 further includes two side-walls 2b and 2c extending vertically and perpendicularly to the upper plate 2a and having respective upper ends fixed to the lower sides of two ends of the upper plate 2a that are positioned between the beveled edges and the unbeveled corners. The cassette 2 is free of a front wall on the lower side of a front end of the upper plate 2a that is positioned between the unbeveled corners. In other words, the cassette 2 has an open front end.

Each of the side-walls 2b and 2c has a plurality of horizontal slots 2d defined in an inner side surface thereof and vertically spaced from one another. Specifically, the slots 2d defined in the inner side surface of the side-wall 2b horizontally confront the respective slots 2d defined in the inner side surface of the side-wall 2c at corresponding heights. The wafer 1 can be retained in the cassette 2 by a pair of horizontally confronting slots 2d at a corresponding height.

A joint bar 2e interconnecting the side-walls 2b and 2c extend between a central portion of the lower end of the inner side surface of the side-wall 2b and a central portion of the lower end of the inner side surface of the side-wall 2c. The joint bar 2e has a width, as measured along the slots 2d, that is smaller than the corresponding width of the side-walls 2b and 2c. The cassette 2 is free of any other structures than the joint bar 2e between the lower ends of the side-walls 2b and 2c, so that the cassette 2 is open in its lower end in front of and behind the joint bar 2e.

There is no limitation on the number of the slots 2d defined in the inner side surfaces of the side-walls 2b and 2c. For example, each of the side-walls 2b and 2c may have as many slots 2d as the number of one lot of wafers 1, e.g., approximately 25 wafers 1. The cassette 2 may be in the form of a cassette having a front lid that can be closed to tightly seal an inner space thereof, known as a front-opening unified pod (FOUP).

The wafer detecting apparatus 4 illustrated in FIG. 1 has a U-shaped detecting unit 6. The detecting unit 6 includes a front connector 6a shaped as a square pole and extending laterally and a pair of arms 6b and 6c shaped as a square pole and extending rearwardly from the respective ends of the front connector 6a. The detecting unit 6 also has a light emitter 8a and a light detector 8b mounted on the distal ends, i.e., rear ends, of the arms 6b and 6c, respectively. The light emitter 8a and the light detector 8b jointly make up a light-transmissive sensor, i.e., a non-contact-type sensor, 8.

The light emitter 8a has a light emission surface facing the light detector 8b, and emits light from the light emission surface toward the light detector 8b. The light detector 8b has a light detection surface facing the light emitter 8a, and detects light emitted from the light emitter 8a with the light detection surface. The light emitted from the light emitter 8a is of a wavelength that is not transmittable through the wafer 1.

Therefore, when the wafer 1 is present between the light emitter 8a and the light detector 8b, the light emitted from the light emitter 8a does not reach the light detector 8b and hence is not detected by the light detector 8b. The non-contact-type sensor 8 detects whether or not the wafer 1 is present between the light emitter 8a and the light detector 8b, on the basis of whether or not the light detector 8b detects light while the light emitter 8a is emitting light toward the light detector 8b.

The detecting unit 6 is coupled to a lifting and lowering unit 10 that selectively lifts and lowers the detecting unit 6 vertically. The lifting and lowering unit 10 has an air cylinder including a piston rod 10a whose upper end is fixed to the lower side of a central portion of the front connector 6a. When the air cylinder is actuated, the piston rod 10a is lifted or lowered, lifting or lowering the detecting unit 6.

The distance between the light emitter 8a and the light detector 8b of the non-contact-type sensor 8 is smaller than the distance between the inner side surface of the side-wall 2b and the inner side surface of the side-wall 2c of the cassette 2. The light emitter 8a and the light detector 8b are disposed one on each side of a front portion of the wafer 1 in the cassette 2 as viewed in plan.

Consequently, while the lifting and lowering unit 10 is operated to lift or lower the detecting unit 6, the non-contact-type sensor 8 is energized to detect the front portion of the wafer 1 in the cassette 2 laterally of the wafer 1, so that the position, i.e., height, of the wafer 1 can be obtained.

Figure 2:
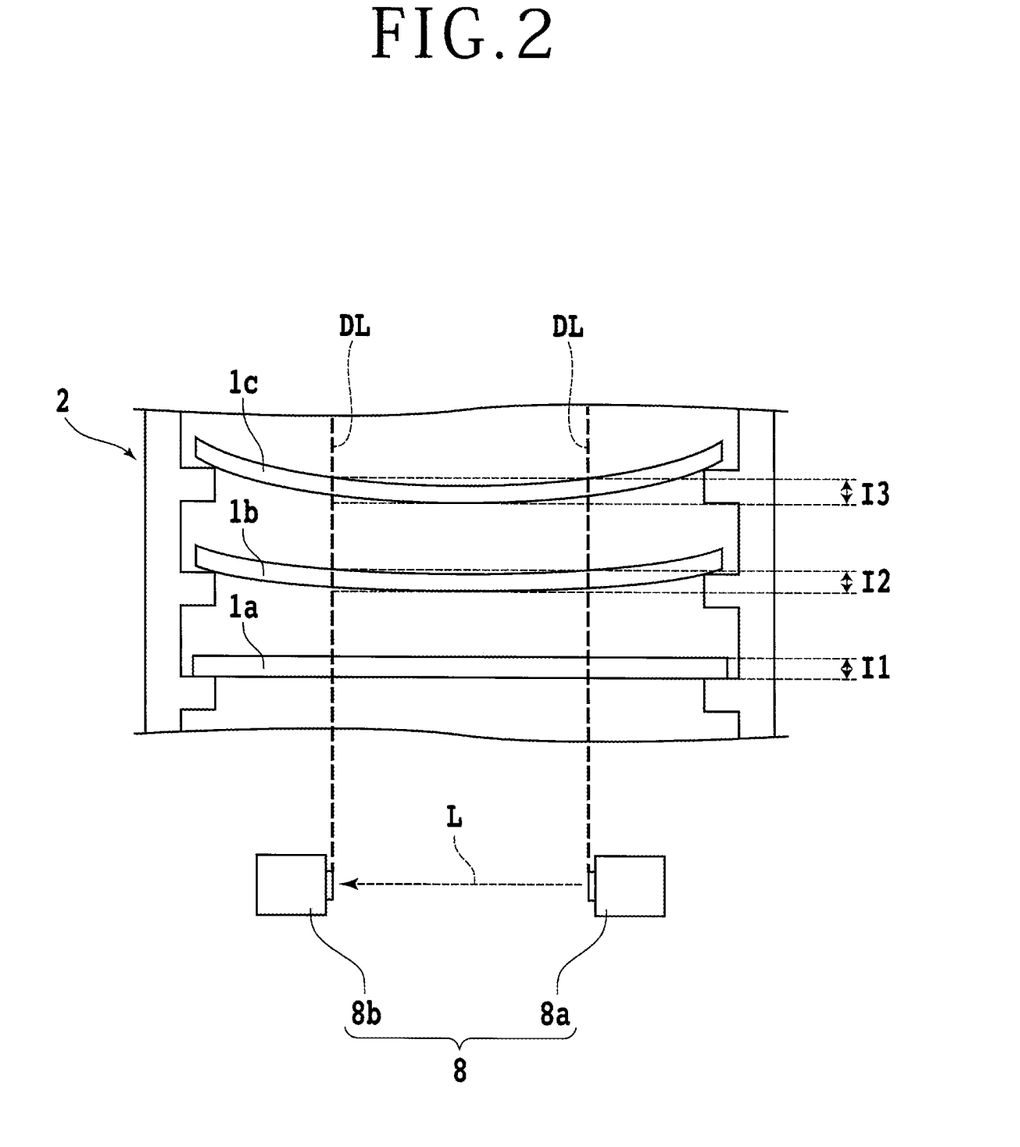
FIG. 2 is a fragmentary front elevational view schematically illustrating the manner in which the wafer detecting apparatus obtains the values of apparent thicknesses of wafers.

Further, the wafer detecting apparatus 4 is able to obtain the apparent thickness of the wafer 1 when the non-contact-type sensor 8 operates as described above. FIG. 2 schematically illustrates in fragmentary front elevation the manner in which the wafer detecting apparatus 4 obtains the apparent thicknesses of wafers 1. As illustrated in FIG. 2, the cassette 2 stores a wafer 1a that is not flexing, a wafer 1b that is slightly flexing, and a wafer 1c that is largely flexing, in such a manner that these wafers are arrayed successively upwardly in the order named.

The light emitter 8a and the light detector 8b of the non-contact-type sensor 8 are positioned below the wafers 1a, 1b, and 1c, and are disposed one on each side of front portions of these wafers in the cassette 2 as viewed in plan.

When the light emitter 8a emits light L toward the light detector 8b while the non-contact-type sensor 8 is being lifted, the light detector 8b does not detect the light L if any one of the wafers 1a, 1b, and 1c is present between a pair of broken lines DL illustrated in FIG. 2.

In this case, therefore, intervals I1, I2, and I3 between the upper and lower ends of the wafers 1a, 1b, and 1c that are present between the broken lines DL can be obtained as the respective values of the apparent thicknesses of the wafers 1a, 1b, and 1c. The larger the flexing of the wafers 1a, 1b, and 1c is, the larger the apparent thicknesses of the wafers 1a, 1b, and 1c are.

Figure 3:
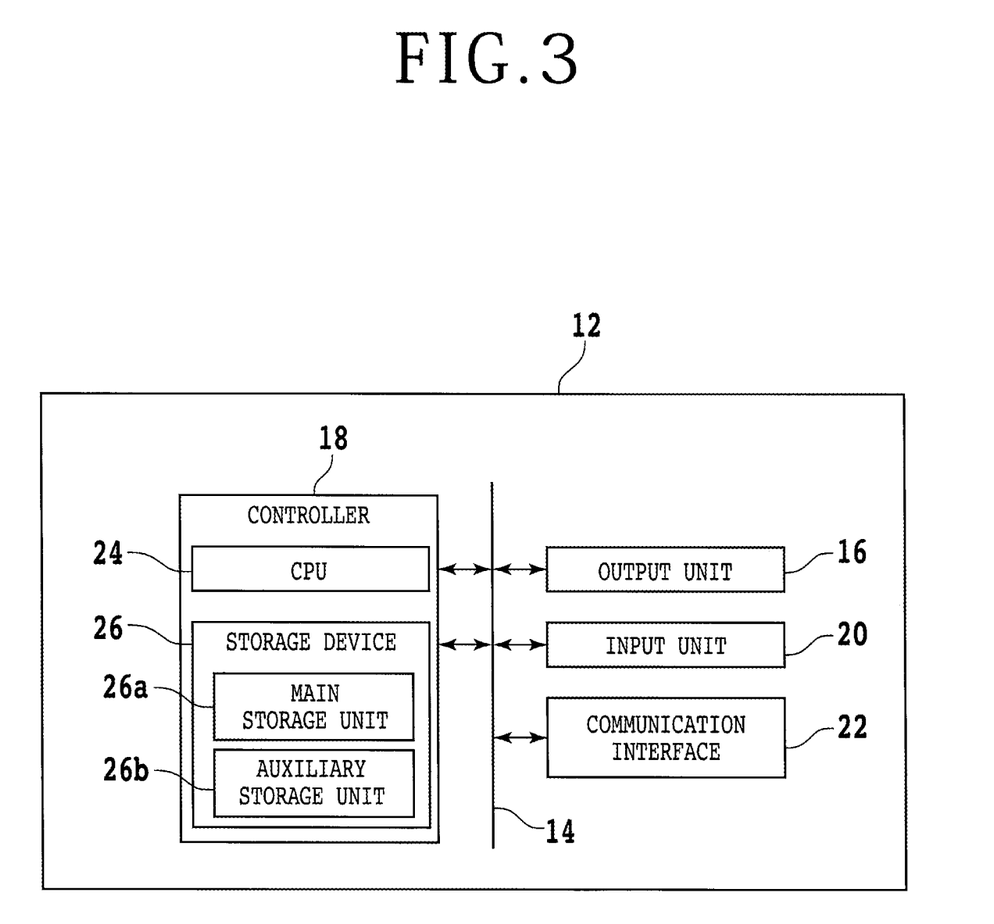
FIG. 3 is a block diagram schematically illustrating hardware components included in a computer.

The wafer detecting apparatus 4 further includes a computer. FIG. 3 schematically illustrates in block form hardware components included in the computer. The computer, denoted by 12 in FIG. 3, includes an output unit 16, a controller 18, an input unit 20, and a communication interface 22 that are interconnected by a bus 14 in such a manner as to send signals to and receive signals from each other.

The output unit 16 outputs information, etc., regarding the wafers 1 stored in the cassette 2. The output unit 16 includes at least one of a display, a printer, a speaker, and a warning lamp, i.e., a pilot lamp. The output unit 16 is used, for example, to issue a warning about an irregularity concerning one or more of the wafers 1 in the cassette 2.

The controller 18 controls the above components of the wafer detecting apparatus 4, i.e., the non-contact-type sensor 8, the lifting and lowering unit 10, and the output unit 16. The controller 18 includes a central processing unit (CPU) 24 and a storage device 26. The storage device 26 includes a main storage unit 26a having a high rewriting speed and an auxiliary storage unit 26b having a large storage capacity.

The main storage unit 26a stores data that is frequently rewritten by the CPU 24. The auxiliary storage unit 26b stores various programs for enabling the CPU 24 to perform certain processing operations, and also stores data, etc., to be used in the processing operations performed by the CPU 24. For example, the auxiliary storage unit 26b stores data to be used in determining whether or not there is an irregularity concerning the wafers 1 stored in the cassette 2.

The step of determining whether or not there is an irregularity concerning the wafers 1 stored in the cassette 2 is carried out by comparing the values of the apparent thicknesses of the wafers 1 that are obtained as described above and the values of actual thicknesses of the wafers 1 that are measured by a known measuring instrument or the like. The data to be used in the determining step includes the values of actual thicknesses of the wafers 1 and a threshold value representing an allowable range or tolerance for the differences between the values of the apparent thicknesses of the wafers 1 and the values of actual thicknesses of the wafers 1, for example.

The CPU 24 reads a program from the auxiliary storage unit 26b and executes the read program. For example, the CPU 24 reads, from the auxiliary storage unit 26b, a program for determining whether or not there is an irregularity concerning the wafers 1 stored in the cassette 2, and issuing a warning if there is a wafer irregularity, and executes the read program.

For example, the CPU 24 determines whether or not the difference between the value of the apparent thickness of a wafer 1 in the cassette 2 and the value of the actual thickness of the wafer 1 exceeds the threshold value. If the difference exceeds the threshold value, then the CPU 24 controls the output unit 16 to issue a warning about an irregularity concerning the wafer 1.

The main storage unit 26*a* includes a volatile memory such as a dynamic random access memory (DRAM) or a static random access memory (SRAM), for example. The auxiliary storage unit 26*b* includes a non-volatile memory such as a solid state drive (SSD), i.e., a not—and (NAND) flash memory, or a hard disk drive (HDD), i.e., a magnetic storage unit, for example.

The input unit 20 enters information regarding the wafers 1 stored in the cassette 2 into the controller 18. The input unit 20 includes at least one of a keyboard, a mouse, a touch pad, and a microphone, and enters data to be used in determining whether or not there is an irregularity concerning the wafers 1 stored in the cassette 2, into the controller 18, for example.

The communication interface 22 includes at least one of communication circuits, i.e., an analog-to-digital conversion circuit (ADC) and a digital-to-analog conversion circuit (DAC), etc., input/output (I/O) ports, etc. The communication interface 22 is used to enter programs recorded in a non-transitory recording medium such as a universal serial bus (USB) flash drive into the controller 18, for example.

The non-transitory recording medium stores therein a program for determining whether or not there is an irregularity concerning the wafers 1 stored in the cassette 2, and issuing a warning if there is a wafer irregularity, for example.

Figure 4:
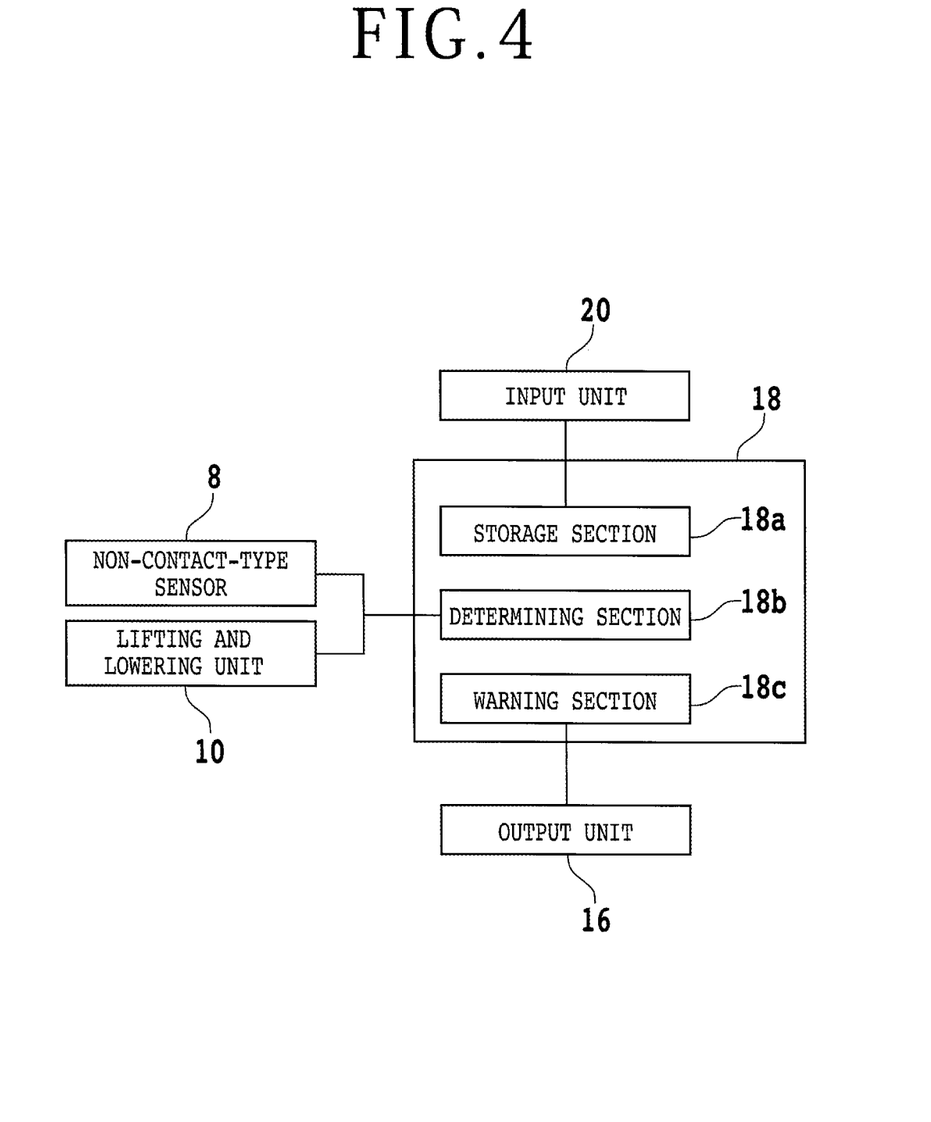
FIG. 4 is a block diagram schematically illustrating functional sections included in a controller.

FIG. 4 schematically illustrates in block form functional sections included in the controller 18. FIG. 4 also illustrates components of the wafer detecting apparatus 4 that are associated with the functional sections of the controller 18. As illustrated in FIG. 4, the controller 18 has a storage section 18*a*, a determining section 18*b*, and a warning section 18*c*.

The storage section 18*a* stores data that is entered from the input unit 20 and that is to be used in determining whether or not there is an irregularity concerning the wafers 1 stored in the cassette 2. For example, providing the input unit 20 includes a keyboard, the storage section 18*a* stores data entered from the keyboard when it is operated by an operator.

In order to obtain the values of the apparent thicknesses of the wafers 1, while actuating the lifting and lowering unit 10 to lift or lower the detecting unit 6, the determining section 18*b* energizes the non-contact-type sensor 8 to detect whether or not there is a wafer 1. Further, the determining section 18*b* determines whether or not the differences between the values of the apparent thicknesses of the wafers 1, which are obtained by actuating the lifting and lowering unit 10 and energizing the non-contact-type sensor 8, and the values of the actual thicknesses of the wafers 1, which are stored in the storage section 18*a*, exceed the threshold value stored in the storage section 18*a*.

If the determining section 18*b* determines that the differences between the values of the apparent thicknesses of the wafers 1 and the values of the actual thicknesses of the wafers 1 exceed the threshold value, then the warning section 18*c* operates the output unit 16 to issue a warning about an irregularity concerning a wafer or wafers 1 stored in the cassette 2. Providing the output unit 16 includes a display and a warning lamp, the warning section 18*c* displays a message indicating the wafer irregularity on the display and also turns on or flashes on and off the warning lamp.

Figure 5:
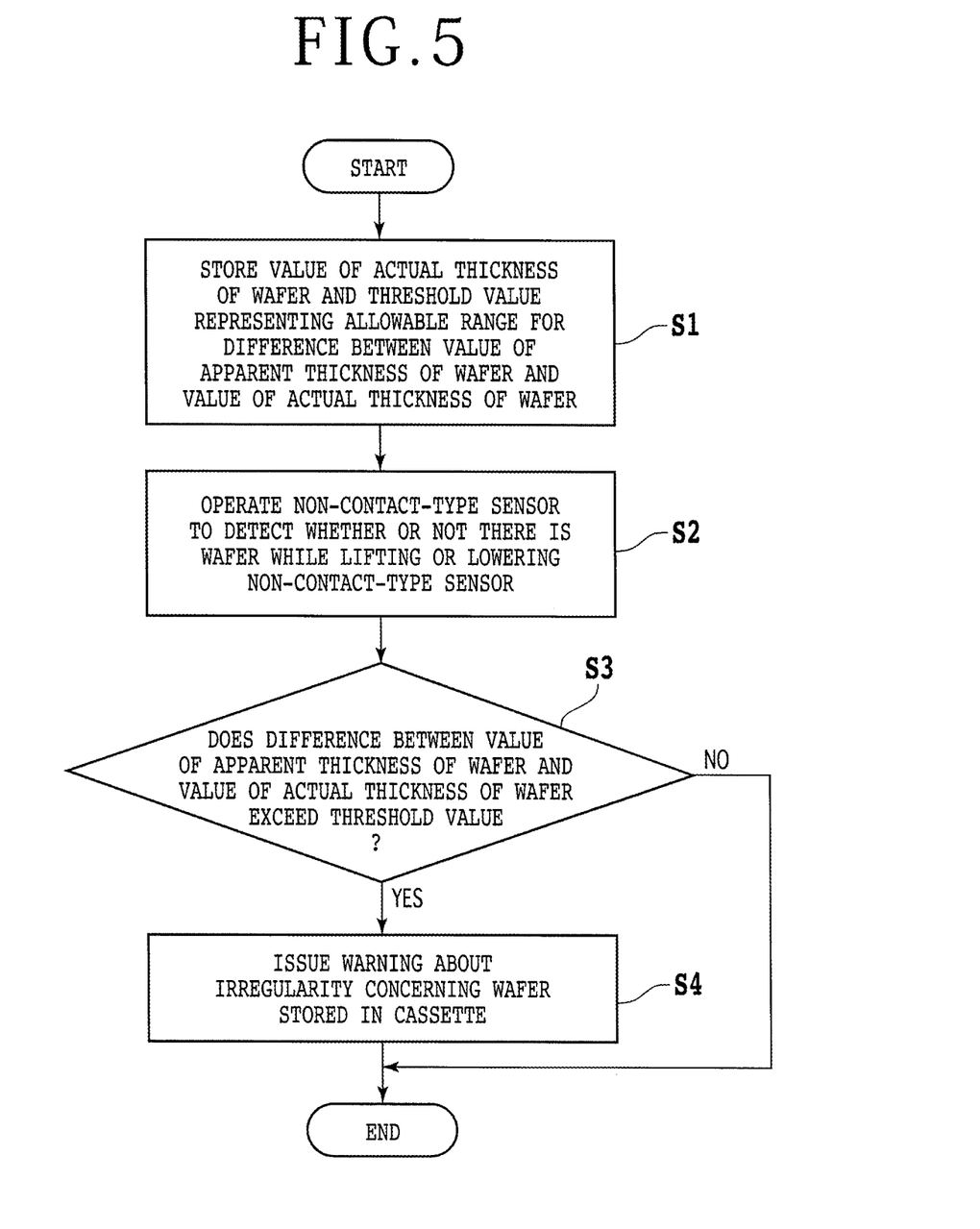
FIG. 5 is a flowchart schematically illustrating by way of example a sequence of a method of determining whether or not there is an irregularity concerning a wafer stored in a cassette.

FIG. 5 schematically illustrates by way of example a sequence of a method of determining whether or not there is an irregularity concerning a wafer 1 stored in the cassette 2, using the wafer detecting apparatus 4. According to the method, the value of the actual thickness of the wafer 1 and the threshold value representing an allowable range or tolerance for the difference between the value of the apparent thickness of the wafer 1 and the value of the actual thickness of the wafer 1 are stored (storing step S1).

Specifically, the operator operates the input unit 20 to enter, into the controller 18, the value of the actual thickness of the wafer 1 that is measured by the known measuring instrument or the like and the threshold value that is established in view of the manner in which the wafer 1 is taken out of the cassette 2. When the value of the actual thickness of the wafer 1 and the threshold value are entered into the controller 18, the CPU 24 stores these entered values into the auxiliary storage unit 26*b* of the storage device 26. In other words, the storage section 18*a* of the controller 18 stores the value of the actual thickness of the wafer 1 and the threshold value therein.

Then, while the non-contact-type sensor 8 is being lifted or lowered, the non-contact-type sensor 8 is energized to detect whether or not there is a wafer 1 in the cassette 2 (detecting step S2). Specifically, the CPU 24, i.e., the determining section 18*b*, actuates the lifting and lowering unit 10 to lift or lower the detecting unit 6, while at the same time energizing the non-contact-type sensor 8 to detect whether or not there is a wafer 1 in the cassette 2.

Therefore, the CPU 24, i.e., the determining section 18*b*, obtains the value of the apparent thickness of the wafer 1. Then, by referring to the value of the apparent thickness of the wafer 1 and the value of the actual thickness of the wafer 1 and the threshold value that are stored in the auxiliary storage unit 26*b*, i.e., the storage section 18*a*, the CPU 24, i.e., the determining section 18*b*, determines whether or not the difference between the value of the apparent thickness of the wafer 1 and the value of the actual thickness of the wafer 1 exceeds the threshold value (determining step S3).

If the difference is determined as exceeding the threshold value in determining step S3 (S3: YES), then a warning is issued about an irregularity concerning the wafer 1 stored in the cassette 2 (warning step S4). Specifically, the CPU 24, i.e., the warning section 18*c*, operates the output unit 16 to issue a warning about an irregularity concerning the wafer 1 stored in the cassette 2.

As described above, the wafer detecting apparatus 4 is able to issue a warning about an irregularity concerning the wafer 1 stored in the cassette 2, if the difference between the value of the apparent thickness of the wafer 1, which is obtained by using the non-contact-type sensor 8 that detects the front portion of the wafer 1 laterally of the wafer 1, and the previously obtained value of the actual thickness of the wafer 1 is in excess of the threshold value. Consequently, the wafer 1 is prevented from being damaged when it is taken out of the cassette 2.

Figure 6:
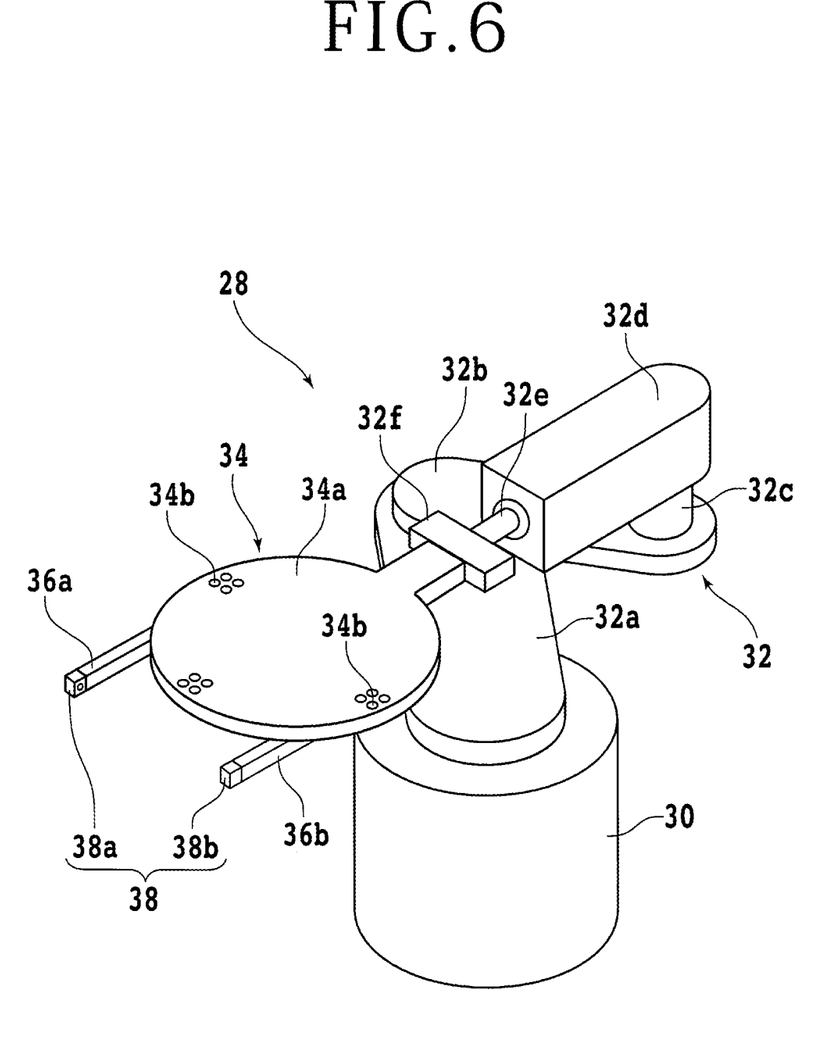
FIG. 6 is a perspective view schematically illustrating a wafer delivery apparatus by way of example.

FIG. 6 schematically illustrates in perspective by way of example a wafer delivery apparatus for removing a wafer 1 from the cassette 2 and bringing a wafer 1 into the cassette 2. In FIG. 6, the wafer 1 and the cassette 2 are omitted from illustration for the sake of convenience.

The wafer delivery apparatus, denoted by 28 in FIG. 6, has a first actuating unit 30 shaped as a cylindrical post extending vertically. The first actuating unit 30 includes a lifting and lowering unit, not illustrated, and a rotary actuator, not illustrated. The lifting and lowering unit has an air cylinder including a piston rod extending through an opening defined in an upper wall of the first actuating unit 30. When actuated, the lifting and lowering unit selectively lifts and lowers a robot hand 34, etc., to be described later.

The rotary actuator rotates the piston rod about a rotational axis that extends vertically. The piston rod has an upper end coupled to a delivery arm assembly 32. The delivery arm assembly 32 is a robot arm assembly having a plurality of joints.

Specifically, the delivery arm assembly 32 includes a plate-shaped first arm 32a extending horizontally. The first arm 32a has an end whose lower side is coupled to an upper end of the piston rod for movement and rotation in unison with the piston rod. The first arm 32a has an opposite end whose upper side is coupled to a lower end of a first joint, not illustrated, shaped as a cylindrical post extending vertically.

The first joint has an upper end coupled to a plate-shaped second arm 32b extending horizontally. The second arm 32b has an end whose lower side is coupled to an upper side of the opposite end of the first arm 32a by the first joint in such a manner that the second arm 32b rotates about a vertically extending rotational axis. The second arm 32b has an opposite end whose upper side is coupled to a lower end of a second joint 32c shaped as a cylindrical post extending vertically.

The second joint 32c has an upper end coupled to a second actuating unit 32d shaped as a rectangular parallelepiped extending horizontally. The second actuating unit 32d has an end whose lower side is coupled to the upper side of the opposite end of the second arm 32b by the second joint 32c in such a manner that the second actuating unit 32d rotates about a vertically extending rotational axis.

The second actuating unit 32d includes an electric motor, not illustrated, for rotating a spindle 32e about a horizontal rotational axis. The spindle 32e extends through an opening defined in a side-wall at an opposite end of the second actuating unit 32d and has a distal end portion exposed out of the second actuating unit 32d. The distal end portion of the spindle 32e is coupled to a proximal end, which is shaped as a rectangular parallelepiped, of the robot hand 34 by a plate-shaped joint member 32f.

The robot hand 34 has a holding plate 34a that is shaped as a circular plate and that is integrally joined to the proximal end of the robot hand 34. The holding plate 34a has a number of suction ports 34b defined in an upper surface thereof acting as a holding surface of the robot hand 34. The suction ports 34b are held in fluid communication with a suction source, not illustrated, such as an ejector through a fluid channel and a fluid control valve that are housed in the robot hand 34, for example.

When the suction source is actuated while the fluid control valve is being open, the suction source generates a negative pressure that is transmitted as suction forces to a space in the robot hand 34 near the suction ports 34b. The wafer delivery apparatus 28 can hold a wafer 1 on the holding surface of the robot hand 34 under the suction forces acting through the suction ports 34b on the wafer 1 when the suction source is in operation.

The robot hand 34 may be replaced with a robot hand that is capable of holding a wafer 1 out of contact therewith. The alternative robot hand is able to hold a wafer under suction forces produced by gas supplied from a gas supply source, on the basis the Bernoulli effect.

Specifically, the robot hand based on the Bernoulli effect has a groove that is defined in a surface thereof and that is supplied with the gas from the gas supply source. When the gas supplied from the gas supply source flows in the groove, it generates a negative pressure in a space near the groove, holding a wafer 1 under suction out of contact with the robot hand.

As illustrated in FIG. 6, the robot hand 34 supports a pair of arms 36a and 36b each shaped as a square pole extending horizontally, on a reverse side thereof that is opposite the holding surface of the robot hand 34. A wafer detecting apparatus includes a light emitter 38a and a light detector 38b that are mounted on the respective distal ends of the arms 36a and 36b. The light emitter 38a and the light detector 38b jointly make up a light-transmissive sensor, i.e., a non-contact-type sensor, 38.

Since the light emitter 38a and the light detector 38b of the non-contact-type sensor 38 are identical respectively to the light emitter 8a and the light detector 8b of the non-contact-type sensor 8 illustrated in FIG. 1, they will not be described in detail below. The wafer delivery apparatus 28 includes a computer, not illustrated. The computer of the wafer delivery apparatus 28 includes the same hardware components as those illustrated in FIG. 3, and includes a controller having the same functional sections as those illustrated in FIG. 4. Therefore, those functional sections will be omitted from description below.

The wafer delivery apparatus 28 can operate according to the method illustrated in FIG. 5. Specifically, the wafer delivery apparatus 28 can issue a warning about an irregularity concerning a wafer 1 stored in the cassette 2, if the difference between the value of an apparent thickness of the wafer 1, which is obtained by using the non-contact-type sensor 38 that detects the front portion of the wafer 1 laterally of the wafer 1, and the previously obtained value of an actual thickness of the wafer 1 is in excess of a threshold value. Consequently, the wafer 1 is prevented from being damaged when it is taken out of the cassette 2.

The wafer delivery apparatus 28 can also tilt the non-contact-type sensor 38, i.e., can change the direction of light emitted from the light emitter 38a toward the light detector 38b, by turning the spindle 32e about its horizontal rotational axis. The wafer delivery apparatus 28 is capable of recognizing more specifically an irregularity concerning wafers 1 stored in the cassette 2, by obtaining the values of apparent thicknesses of the wafers 1 with the non-contact-type sensor 38 that is selectively set in differently tilted states.

Figure 7A:
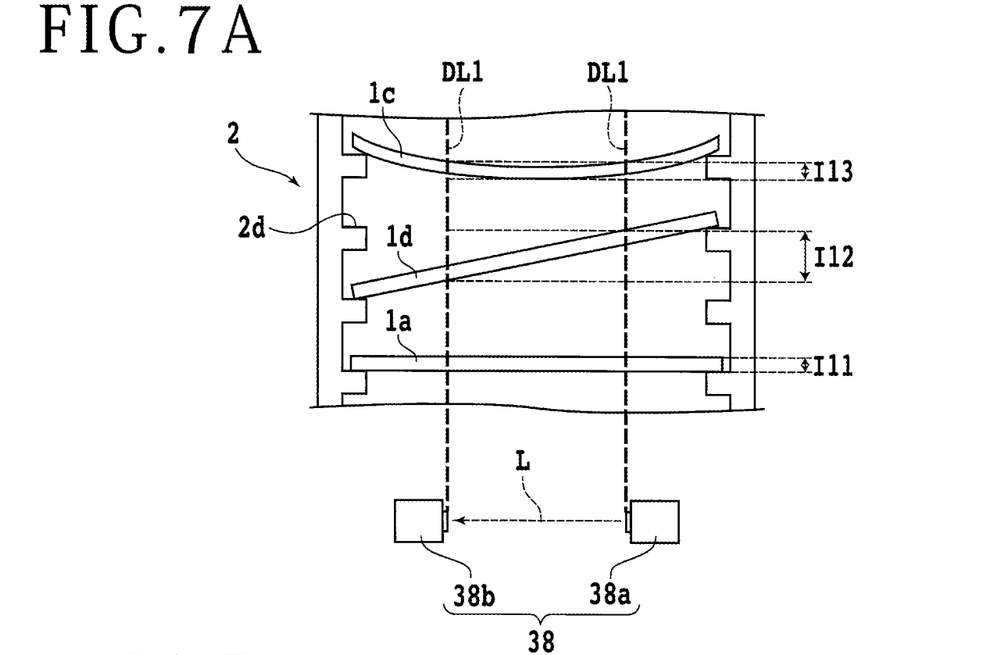
FIG. 7A is a fragmentary front elevational view schematically illustrating the manner in which the wafer detecting apparatus obtains the values of apparent thicknesses of wafers.
Figure 7B:
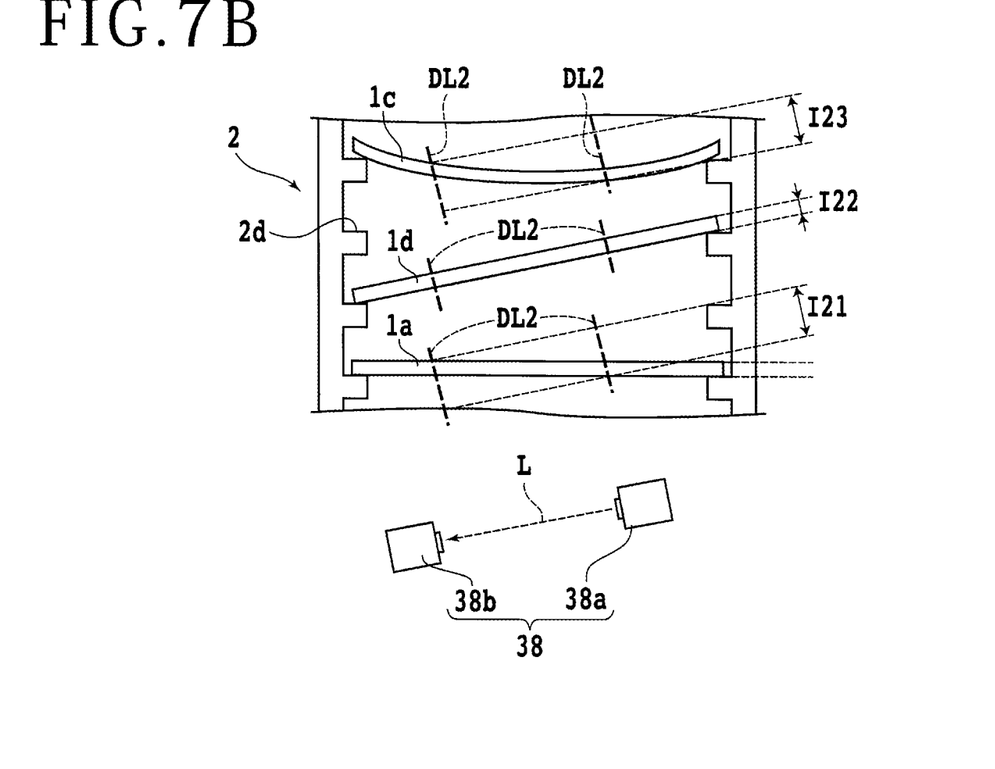
FIG. 7B is a fragmentary front elevational view schematically illustrating the manner in which the wafer detecting apparatus obtains the values of apparent thicknesses of wafers.

FIGS. 7A and 7B schematically illustrate in plan the manner in which the wafer detecting apparatus incorporated in the wafer delivery apparatus 28 obtains the values of apparent thicknesses of wafers 1. As illustrated in FIGS. 7A and 7B, the cassette 2 stores therein a wafer 1a that is not flexing, a wafer 1d that is not flexing but skewed, i.e., that is retained by a pair of slots 2d at different heights, and a wafer 1c that is largely flexing, in such a manner that these wafers are arrayed successively upwardly in the order named.

The light emitter 38a and the light detector 38b of the non-contact-type sensor 38 illustrated in FIGS. 7A and 7B are positioned below the wafers 1a, 1d, and 1c, and are disposed one on each side of front portions of these wafers in the cassette 2 as viewed in plan.

In FIG. 7A, the non-contact-type sensor 38 is not tilted with respect to horizontal directions, i.e., is aligned with horizontal directions. Therefore, light emitted from the light emitter 38a toward the light detector 38b travels in a direction parallel to the horizontal directions. In FIG. 7B, the non-contact-type sensor 38 is tilted with respect to horizontal directions, i.e., is not aligned with horizontal directions.

Therefore, light emitted from the light emitter 38a toward the light detector 38b travels in a direction not parallel to the horizontal directions.

When the light emitter 38a emits light L toward the light detector 38b while the non-contact-type sensor 38 is being lifted, the light detector 38b does not detect the light L if any one of the wafers 1a, 1d, and 1c is present between a pair of broken lines DL1 illustrated in FIG. 7A or between a pair of broken lines DL2 illustrated in 7B.

In this case, therefore, intervals I11, I12, and I13 between the upper and lower ends of the wafers 1a, 1d, and 1c that are present between the pair of broken lines DL1 and intervals I21, I22, and I23 between the upper and lower ends of the wafers 1a, 1d, and 1c that are present between the pair of broken lines DL2 can be obtained as the values of apparent thicknesses of the wafers 1a, 1d, and 1c.

Specifically, the values of the apparent thicknesses of the wafers 1a and 1c that are retained by the pairs of slots 2d positioned at the corresponding heights are increased by tilting the non-contact-type sensor 38. On the other hand, the value of the apparent thickness of the wafer 1d retained by the pair of slots 2d at different heights is reduced by tilting the non-contact-type sensor 38.

Stated otherwise, it can be recognized whether or not the wafer 1d is unduly skewed in the cassette 2, on the basis of whether or not the value of the apparent thickness of the wafer 1d increases when the tilt of the non-contact-type sensor 38 increases. The value of the apparent thickness of the wafer 1d may be obtained while the non-contact-type sensor 38 is tilted such that the light emitter 38a is higher than the light detector 38b as illustrated in FIG. 7B or while the non-contact-type sensor 38 is tilted such that the light emitter 38a is lower than the light detector 38b.

Alternatively, the value of the apparent thickness of the wafer 1d may be obtained while the non-contact-type sensor 38 is in one of the three positional states: the non-contact-type sensor 38 is in the state as illustrated in FIF. 7A, i.e., the non-contact-type sensor 38 is aligned with the horizontal directions; the non-contact-type sensor 38 is in the state as illustrated in FIG. 7B, i.e., the non-contact-type sensor 38 is tilted such that the light emitter 38a is higher than the light detector 38b; or the non-contact-type sensor 38 is tilted such that the light emitter 38a is lower than the light detector 38b.

The structural details and method according to the above embodiment and modifications may be changed or modified without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer detecting apparatus for detecting whether or not there is a wafer in a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at a same height in confronting relation to each other, the wafer detecting apparatus comprising:
    a detecting unit having a non-contact-type sensor for detecting a front portion of the wafer laterally of the wafer in the cassette that has an open front end;
    a lifting and lowering unit for selectively lifting and lowering the detecting unit vertically;
    a tilting unit for selectively rotating the detecting unit about a horizontal rotational axis;
    an output unit for outputting information regarding the wafer stored in the cassette;
    a controller for controlling operation of the detecting unit, the lifting and lowering unit, the tilting unit, and the output unit; and
    an input unit for entering information regarding the wafer stored in the cassette into the controller, wherein
    the controller includes
        a storage section for storing a value of an actual thickness of the wafer stored in the cassette, the value being entered from the input unit, and a threshold value representing an allowable range for a difference between a value of an apparent thickness of the wafer and the value of the actual thickness of the wafer,
        a determining unit for determining whether or not the difference between the value of the apparent thickness of the wafer and the value of the actual thickness of the wafer that has been stored in the storage section exceeds the threshold value, the value of the apparent thickness of the wafer being obtained by operating, while actuating the lifting and lowering unit to selectively lift and lower the detecting unit and while actuating the tilting unit to selectively rotate the detecting unit about the horizontal rotational axis, the non-contact-type sensor to detect whether or not there is the wafer in the cassette, and
        a warning section for operating the output unit to issue a warning about an irregularity concerning the wafer stored in the cassette, if the determining section determines that the difference exceeds the threshold value.

2. The wafer detecting apparatus according to claim 1, wherein the non-contact-type sensor is a light-transmissive sensor that includes a light emitter for emitting light and a light detector for detecting the light emitted from the light emitter.

3. A wafer delivery apparatus for taking a wafer out of and into a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at a same height in confronting relation to each other, the wafer delivery apparatus comprising:
    a robot hand for holding the wafer, the robot hand having a non-contact-type sensor for detecting a front portion of the wafer laterally of the wafer in the cassette that has an open front end;
    a lifting and lowering unit for selectively lifting and lowering the robot hand vertically;
    a tilting unit for selectively rotating the robot hand about a horizontal rotational axis;
    an output unit for outputting information regarding the wafer stored in the cassette;
    a controller for controlling operation of the robot hand, the lifting and lowering unit, the tilting unit, and the output unit; and
    an input unit for entering information regarding the wafer stored in the cassette into the controller, wherein
    the controller includes
        a storage section for storing a value of an actual thickness of the wafer stored in the cassette, the value being entered from the input unit, and a threshold value representing an allowable range for a difference between a value of an apparent thickness of the wafer and the value of the actual thickness of the wafer, a determining unit for determining whether or not the difference between the value of the apparent thickness of the wafer and the value of the actual thickness of the wafer that has been stored in the storage section exceeds the threshold value, the value of the apparent thickness of the wafer being obtained by operating, while actuating the lifting and lowering unit to selectively lift and lower the robot hand and while actuating, the tilting unit to selectively rotate the robot hand about a horizontal rotational axis, the non-contact-type sensor to detect whether or not there is the wafer in the cassette, and a warning section for operating the output unit to issue a warning about an irregularity concerning the wafer stored in the cassette, if the determining section determines that the difference exceeds the threshold value.

4. The wafer delivery apparatus according to claim 3, wherein the non-contact-type sensor is a light-transmissive sensor that includes a light emitter for emitting light and a light detector for detecting the light emitted from the light emitter.

5. The wafer delivery apparatus according to claim 3, wherein the robot hand is a robot hand for holding the wafer under suction forces generated by a suction source, or a robot hand for holding the wafer under suction forces produced by gas supplied from a gas supply source, on a basis the Bernoulli effect.

6. The wafer delivery apparatus according to claim 4, wherein the robot hand is a robot hand for holding the wafer under suction forces generated by a suction source, or a robot hand for holding the wafer under suction forces produced by gas supplied from a gas supply source, on a basis the Bernoulli effect.

7. A method of determining whether or not there is an irregularity concerning a wafer stored in a cassette that has opposite side-walls in which a plurality of pairs of slots vertically spaced from one another are defined and that is capable of storing wafers in such a manner that each of the wafers is retained by a corresponding one of the pairs of slots, the pair of slots being positioned at a same height in confronting relation to each other, the method comprising:

a storing step of storing a value of an actual thickness of the wafer stored in the cassette and a threshold value representing an allowable range for a difference between a value of an apparent thickness of the wafer and the value of the actual thickness of the wafer;

a determining step of determining whether or not the difference between the value of the apparent thickness of the wafer and the value of the actual thickness of the wafer that has been stored in the storing step exceeds the threshold value, the value of the apparent thickness of the wafer being obtained by operating, while selectively lifting, lowering, and selectively rotating about a horizontal rotational axis a non-contact-type sensor for detecting a front portion of the wafer laterally of the wafer in the cassette that has an open front end, the non-contact-type sensor to detect whether or not there is the wafer in the cassette; and a warning step of issuing a warning about an irregularity concerning the wafer stored in the cassette, if the determining step determines that the difference exceeds the threshold value.

8. The wafer detecting apparatus according to claim 1, wherein the tilting unit selectively rotates the detecting unit about the horizontal rotational axis such that the determining unit determines whether the wafer is flexing or skewed.

* * * * *